(12) United States Patent
Wu et al.

(10) Patent No.: US 10,707,179 B1
(45) Date of Patent: Jul. 7, 2020

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Tung-Jiun Wu, Hsinchu County (TW); Yinlung Lu, Hsinchu (TW); Mingni Chang, Hsinchu (TW); Ming-Yih Wang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/450,536

(22) Filed: Jun. 24, 2019

(51) Int. Cl.
| H01L 21/00 | (2006.01) |
| H01L 23/00 | (2006.01) |
| H01L 23/522 | (2006.01) |
| H01L 21/768 | (2006.01) |
| H01L 49/02 | (2006.01) |

(52) U.S. Cl.
CPC ...... H01L 23/562 (2013.01); H01L 21/76804 (2013.01); H01L 21/76843 (2013.01); H01L 21/76877 (2013.01); H01L 23/5223 (2013.01); H01L 24/03 (2013.01); H01L 24/05 (2013.01); H01L 24/13 (2013.01); H01L 28/60 (2013.01); H01L 2224/0219 (2013.01); H01L 2224/02181 (2013.01); H01L 2224/03011 (2013.01); H01L 2224/0401 (2013.01); H01L 2224/05025 (2013.01); H01L 2224/13026 (2013.01); H01L 2224/13147 (2013.01); H01L 2924/05042 (2013.01); H01L 2924/05442 (2013.01); H01L 2924/1205 (2013.01); H01L 2924/3512 (2013.01)

(58) Field of Classification Search
CPC ......... H01L 21/76804; H01L 21/76843; H01L 21/76877; H01L 23/562; H01L 23/5223; H01L 23/481; H01L 23/5225; H01L 24/03; H01L 24/05; H01L 24/13; H01L 28/60; H01L 28/90; H01L 28/86; H01L 28/87; H01L 2224/02181; H01L 2224/0219; H01L 2224/03011; H01L 2224/0401; H01L 2224/05025; H01L 2224/13026; H01L 2224/13147; H01L 2924/05042; H01L 2924/05442; H01L 2924/1205; H01L 2924/3512
See application file for complete search history.

(56) References Cited

U.S. PATENT DOCUMENTS

| 8,258,545 B1 * | 9/2012 | Huang | H01L 29/7378 257/197 |
| 8,629,960 B2 * | 1/2014 | Moriwaki | G02F 1/136227 349/122 |
| 2011/0199564 A1 * | 8/2011 | Moriwaki | G02F 1/136227 349/122 |

* cited by examiner

Primary Examiner — Nikolay K Yushin
(74) Attorney, Agent, or Firm — WPAT, P.C., Intellectual Property Attorneys; Anthony King

(57) ABSTRACT

A semiconductor structure including a MIM capacitor includes a substrate, a MIM capacitor disposed over the substrate, a first insulating layer disposed over the MIM capacitor, an ONON stack disposed over the first insulating layer, a connecting via disposed in the first insulating layer, and a connecting pad disposed in the ONON stack and in contact with the connecting via. The ONON stack covers sidewalls of the connecting pad and a portion of a top surface of the connecting pad.

20 Claims, 15 Drawing Sheets

SEMICONDUCTOR STRUCTURE AND METHOD FOR FORMING THE SAME

BACKGROUND

Integrated chips are formed on semiconductor dies that include millions or billions of transistor devices. The transistor devices are configured to act as switches and/or to produce power gains so as to enable logical functionality for an integrated chip (e.g., functionality to perform logic functions). Integrated chips often also include passive devices, such as capacitors, resistors, inductors, varactors, etc. Passive devices are widely used to control integrated chip characteristics (e.g., gain, time constants, etc.) and to provide an integrated chip with a wide range of different functionalities (e.g., incorporating both analog and digital circuitry on the same die).

Of the passive devices, capacitors such as the metal-insulator-metal (MIM) capacitors, which include at least a top metal plate and a bottom metal plate separated by a capacitor dielectric, are often implemented in integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
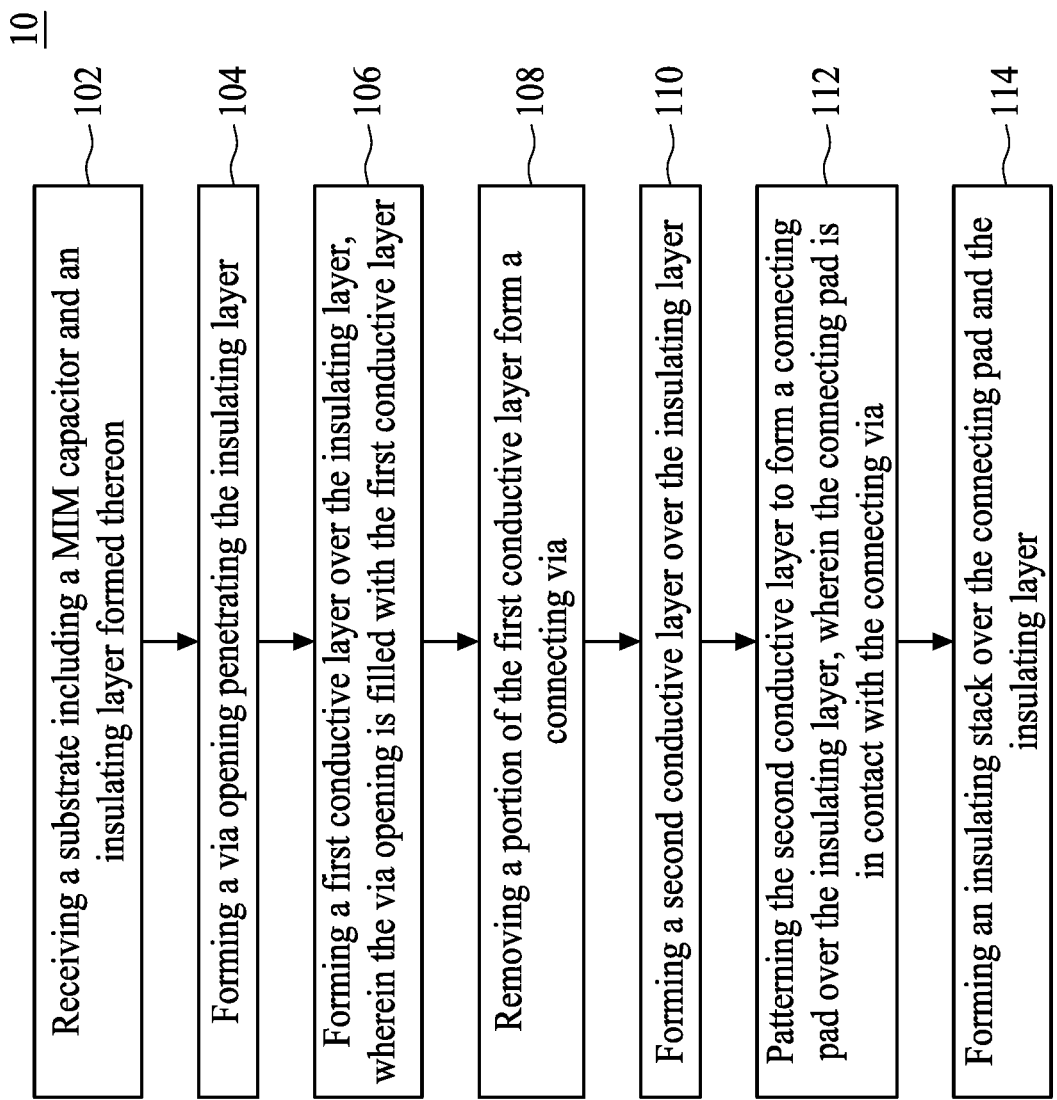
FIG. 1 is a flowchart representing a method for manufacturing a semiconductor structure including a MIM capacitor according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

MIM capacitors can be used as decoupling capacitors configured to mitigate power variances in supply or switching noise caused by changes in current. In some embodiments, MIM capacitors are integrated in a back-end-of-the-line (BEOL) metallization stack, at a position that is disposed between an underlying metal layer and an overlying metal layer. However, positioning a MIM capacitor within a BEOL metallization stack can present a number of fabrication problems. For example, MIM capacitors typically have a large number of layers that lead to a topography (e.g., having a step size of more than 400 nanometers (nm)) that is more irregular than most BEOL metallization layers. In some embodiments, MIM capacitors are therefore disposed over, instead of within, the BEOL metallization stack to avoid the topography problem. In some embodiments, MIM capacitors are disposed within or over a redistribution layer (RDL). However, such approach still incurs the topography problem. To mitigate the topography problem, a thick insulating layer serving as a passivation layer is provided. Further, the thick passivation layer helps to resist stress when forming a bonding pad or chip-to-package interaction (CPI).

However, the thick passivation layer causes another issue. During the forming of a connecting via which is used to provide connection between the MIM capacitor and pad or between the MIM capacitor and the CPI, a deep via opening is formed in the thick passivation layer and a conductive material is formed to fill the deep via opening. However, an overhang is usually formed due to the high aspect ratio of the via opening, and a void or a crack may be formed in the connecting via. The void in the connecting via not only adversely impacts electric connection but also creates further problems.

In some embodiments, generally, after the forming of the passivation layer over the bonding pad, a pin hole test is performed on the resulting structure. In some embodiments, the pin hole test is performed with acid solution under heat, to ensure the passivation layer protects the bonding pad from being corroded by the acid solution. In some embodiments, the passivation layer has a good acid resistance and thus protects the bonding pad from being corroded by the acid solution. Accordingly, the semiconductor device passes the pin hole test. That is, the bonding pad and the semiconductor via device are determined to have good reliability. On the other hand, in a comparative embodiment, when the passivation layer has cracks, the underlying conductive elements will be corroded by the acid solution through the cracks in the passivation layer. When the connecting via has the void, the corrosion may severely damage the underlying conductive elements through the crack in the passivation and through the crack in the connecting via. Therefore, there is a need to mitigate the void or crack issue in the connecting via.

The present disclosure therefore provides a semiconductor structure including a MIM capacitor and a method for forming the connection that is able to mitigate the void or crack issue in the connecting via.

FIG. 1 is a flowchart representing a method for manufacturing a semiconductor structure including a MIM capacitor according to aspects of the present disclosure. The method 10 includes an operation 102, receiving a substrate having a MIM capacitor and an insulating layer formed thereon. In some embodiments, the insulating layer covers the MIM capacitor entirely. The method 10 further includes an operation 104, forming a via opening penetrating the insulating layer. The method 10 further includes an operation 106, forming a first conductive layer over the insulating layer. The via opening is filled with the first conductive layer. The method 10 further includes an operation 108, removing a portion of the first conductive layer to form a connecting via. The method 10 further includes an operation 110, forming a second conductive layer over the insulating layer. The method 10 further includes an operation 112, patterning the second conductive layer to form a connecting pad over the insulating layer. In some embodiments the connecting pad is in contact with the connecting via. The method 10 further includes an operation 114, forming an insulating stack over the connecting pad and the insulating layer. The method 10 will be further described according to one or more embodiments. It should be noted that the operations of the method 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2:
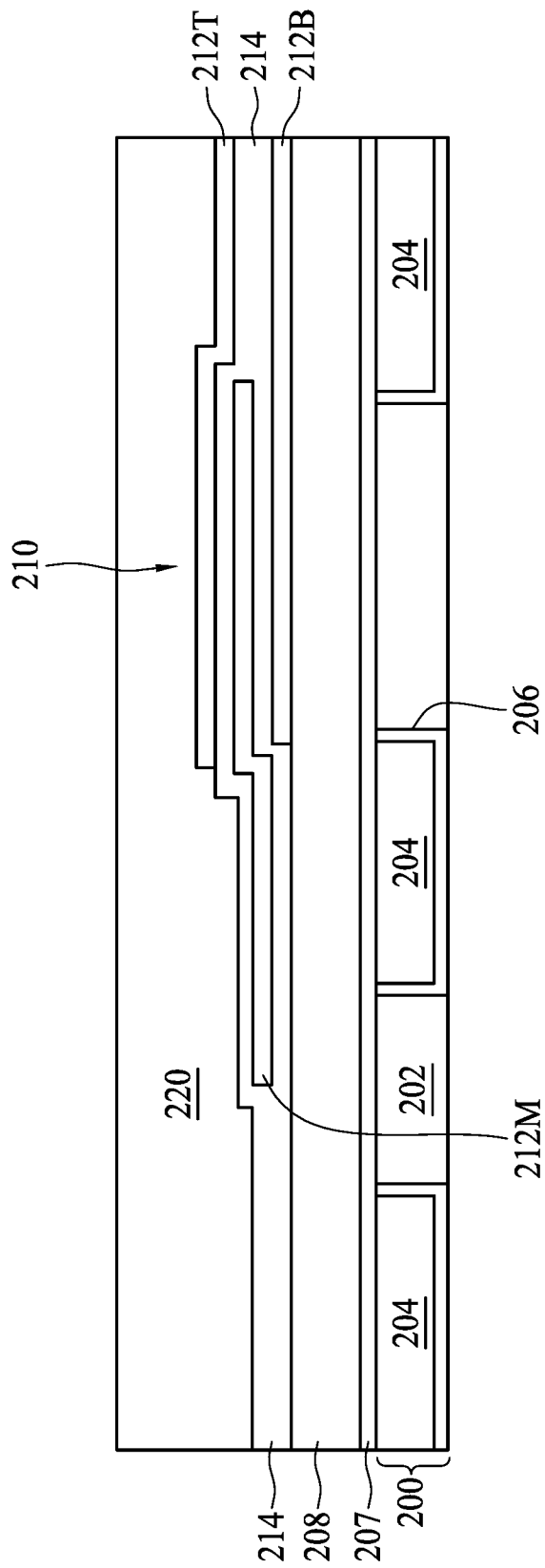
FIGS. 2, 3, 4, 5, 6, 7A, 7B, 8, 9, 10, 11, 12 and 13 are schematic drawings illustrating a semiconductor structure including a MIM capacitor at various fabrication stages constructed according to aspects of the present disclosure in one or more embodiments.

FIGS. 2 to 13 are schematic drawings illustrating a semiconductor structure including a MIM capacitor 20 at various fabrication stages constructed according to aspects of the present disclosure in one or more embodiments. Referring to FIG. 2, a substrate 200 is received or provided according to operation 102. In some embodiments, the substrate 200 (also referred to as a die substrate) may be a bulk silicon substrate or a silicon-on-insulator (SOI) substrate. In other embodiments, the substrate 200 may include semiconductor materials that include group III, group IV, and/or group V elements. For example, the substrate 200 may include germanium (Ge), silicon germanium (SiGe), silicon carbide (SiC), gallium arsenide (GaAs), or the like. The substrate 200 may be a p-type semiconductive substrate (acceptor type) or an n-type semiconductive substrate (donor type).

Various electrical components may be formed over the substrate 200. Examples of the electrical components include active devices, such as transistors and diodes, and passive devices, such as capacitors, inductors, and resistors. The substrate 200 can include an interconnection structure disposed therein. The interconnection structure may include conductive features, such as conductive lines or conductive vias, and insulating layers 202 electrically insulating the conductive features. The conductive lines at a same level are collectively referred to as a metal layer or a connecting layer. In some embodiments, the interconnection structure may include a plurality of connecting layers that are interconnected through the conductive vias, though not shown. Referring to FIG. 2, a topmost connecting layer 204 of the interconnection structure is shown. It should be easily realized only insulating layer 202 and the topmost connecting layer 204 are shown in FIG. 2 for clarity, however those skilled in the art would easily realize that other connecting layers can be disposed in the insulating layers 202 according to different design requirements.

In some embodiments, the connecting layer 204 may include a metal such as copper (Cu), tungsten (W), or aluminum (Al), but the disclosure is not limited to this. Additionally, a barrier layer 206 sandwiched between the connecting layer and the insulating layer 202 is provided to prevent metal diffusion, but the disclosure is not limited thereto.

Still refer to FIG. 2, insulating layers 207 and 208 can be disposed over the substrate 200. In some embodiments, the insulating layers 207 and 208 may be formed with a variety of dielectric materials and may, for example, be oxide (e.g., Ge oxide), nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like. In an alternative embodiment, the insulating layer 208 include a polymeric material such as polyimide (PI), polybenzoxazole (PBO), benzocyclobuten (BCB), epoxy, or the like. In some embodiments, the insulating layers 207 and 208 can include different materials. For example, the insulating layer 207 can include a SiN layer and the insulating layer 208 can be a plasma enhanced oxide (PEOX)-undoped silicate glass (USG) (PEOX-USG) layer, but the disclosure is not limited to this. The insulating layers 207 and 208 may be formed using a CVD, PVD, spin-on coating, or other suitable operation. In an embodiment, the insulating layer 207 has a thickness between approximately 500 Angstroms (Å) and approximately 1000 Å, but the disclosure is not limited to this. In an embodiment, the insulating layer 208 has a thickness between approximately 4000 Å and approximately 5000 Å, but the disclosure is not limited to this.

Still referring to FIG. 2, a MIM capacitor 210 can be formed over the substrate 200 according to operation 102. The MIM capacitor 210 can include a bottom electrode layer 212B, a middle electrode layer 212M and a top electrode layer 212T formed over the substrate 200. In some embodiments, the bottom electrode layer 212B, the middle electrode layer 212M and the top electrode layer 212T may include various conductive materials, such as indium tin oxide (ITO), aluminum (Al), titanium (Ti), titanium nitride (TiN), tantalum (Ta), tantalum nitride (TaN), tungsten (W), tungsten nitride (WN), molybdenum nitride (MoN), copper (Cu), platinum (Pt), palladium (Pd), osmium (Os), ruthenium (Ru), iridium dioxide ($IrO_2$), rhenium dioxide ($ReO_2$), rhenium trioxide ($ReO_3$), or a combination thereof. In some embodiments, a thickness of the bottom electrode layer 212B, the middle electrode layer 212M and the top electrode layer 212T may be between approximately 100 angstroms (Å) and approximately 800 Å a thickness of the bottom electrode layer 212B, the middle electrode layer 212M and the top electrode layer 212T may be between approximately 300 Å and approximately 500 Å, but the disclosure is not limited to this.

A capacitor dielectric layer 214 is formed between the electrode layers 212B, 212M and 212T. Further, the capacitor dielectric layer 214 is conformally formed to cover the bottom electrode layer 212B and the middle electrode layer 212M. In some embodiments, the capacitor dielectric layer 214 may include a high-k dielectric material (i.e., a dielectric material having a dielectric constant greater than silicon dioxide ($SiO_2$)). In various embodiments, the capacitor dielectric layer 214 can include a single layer. In other embodiments, the capacitor dielectric layer 214 can include a multiple layer of $SiO_2$, silicon nitride ($Si_4N_4$), aluminum oxide ($Al_2O_3$), tantalum oxide ($Ta_2O_5$), titanium oxide ($TiO_2$), strontium titanate ($SrTiO_4$), zirconium oxide ($ZrO_2$), hafnium oxide ($HfO_2$), hafnium silicate ($HfSiO_4$), lanthanum oxide ($La_2O_4$), yttrium oxide ($Y_2O_3$), etc. In some embodiments, the capacitor dielectric layer 214 may include stacked layers of $ZrO_2/Al_2O_4/ZrO_2$ (ZAZ), but the disclosure is not limited to this. In some embodiments, a thickness of the capacitor dielectric layer 214 can be between approximately 20 Å and approximately 200 Å, but the disclosure is not limited to this. In some embodiment, each layer of the ZAZ stack includes a thickness approximately 60 Å, but the disclosure is not limited thereto. In some embodiments, an etch stop layer (not shown) can be formed on the top electrode layer 212T, but the disclosure is not limited to this.

Still to Referring to FIG. 2, an insulating layer 220 is formed on the substrate 200 according to operation 102. Further, the insulating layer 220 covers the MIM capacitor 210 entirely. In some embodiments, the insulating layer 220 can be formed and then planarized to obtain an even surface, as shown in FIG. 2A. The insulating layer 220 can include a low-k dielectric material, such as PEOX-USG, but the disclosure is not limited thereto. In some embodiments, a thickness of the insulating layer 220 can be between approximately 20 k Å and approximately 50 k Å, but the disclosure is not limited to this. The insulating layer 220 not only provides electrical isolation, but also provides sufficient mechanical strength to withstand stress. In some embodiments, the thickness of the insulating layer 220 can be even greater than 50 k Å in order to withstand the stress.

Figure 3:
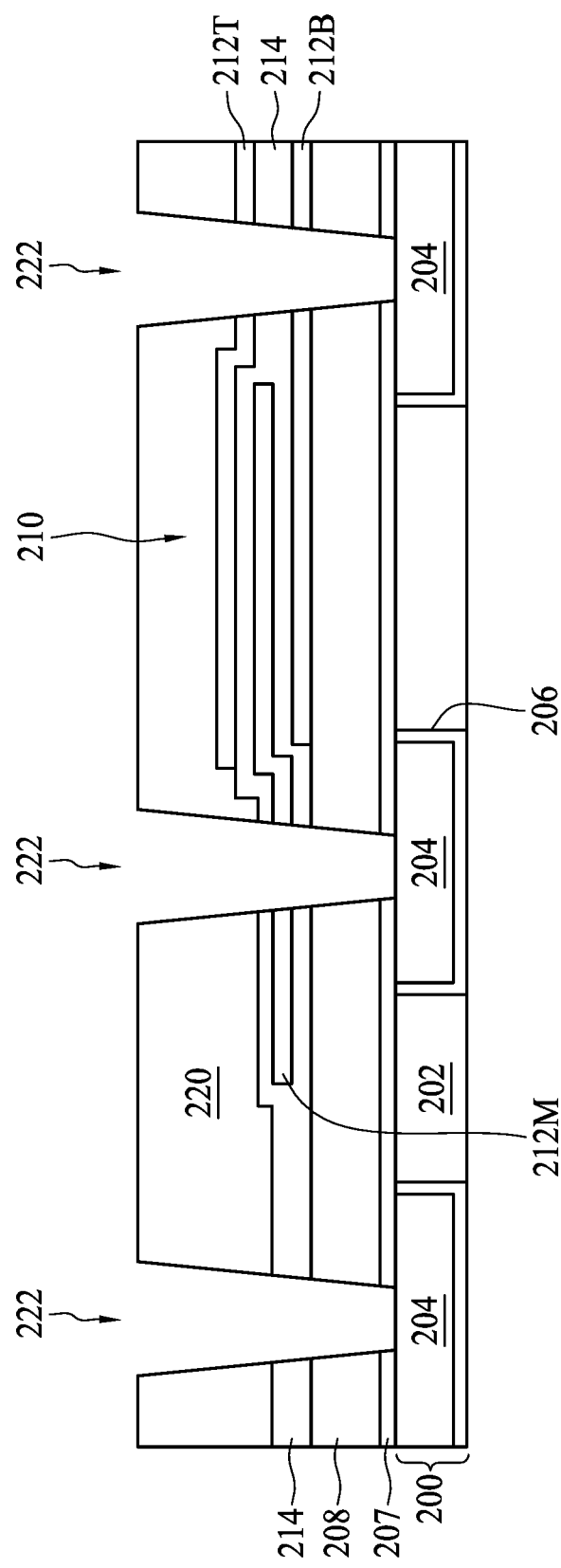

Referring to FIG. 3, a via opening 222 penetrating the insulating layer 220 is formed, according to operation 104.

In some embodiments, the via opening 222 penetrates the capacitor dielectric layer 214 and the insulating layers 208 and 207. Consequently, the capacitor dielectric layer 214 and the insulating layers 220, 208 and 207 are exposed through sidewalls of the via opening 222, while the connecting layer 204 is exposed through a bottom of the via opening 222. It should be noted that a depth of the via opening 222 is a sum of a thickness of the capacitor dielectric layer 214 and a thickness of the insulating layers 220, 208 and 207. In some embodiments, the via opening 222 penetrates not only the capacitor dielectric layer 214 and the insulating layers 220, 208 and 207, but also the middle electrode layer 212M. In such embodiments, the connecting layer 204 is exposed through a bottom of the via opening 222. In other embodiments, the via opening 222 penetrates the insulating layer 220, the top electrode layer 212T, the capacitor dielectric layer 214, the bottom electrode layer 212B and the insulating layers 208 and 207, with the connecting layer 214 being exposed through a bottom of the via opening 222.

Figure 4:
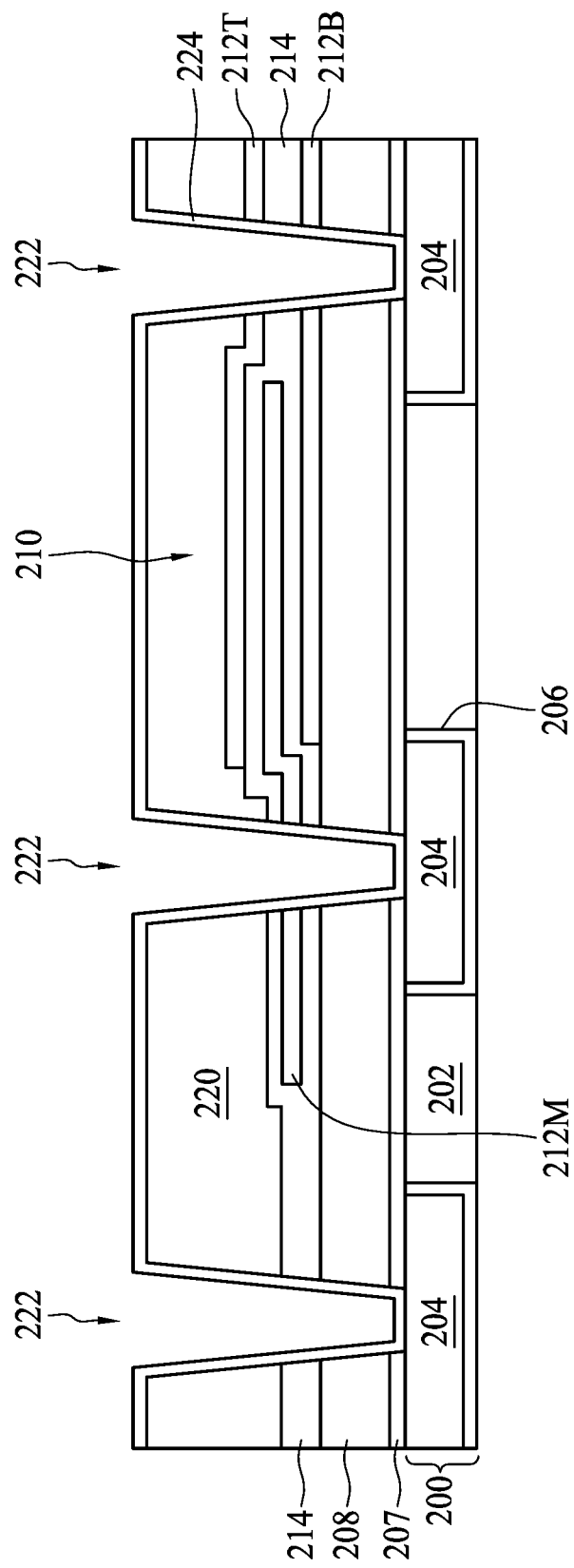

Referring to FIG. 4, a barrier layer 224 can be formed. In some embodiments, the barrier layer 224 includes a single layer. In some alternative embodiments, the barrier layer 224 includes a multiple layer. For example but not limited to this, the barrier layer 224 can include tantalum (Ta), tantalum nitride (TaN), titanium (Ti) or titanium nitride (TiN). As shown in FIG. 4, the bottom and sidewalls of the via opening 222 are lined by the barrier layer 224.

Figure 5:
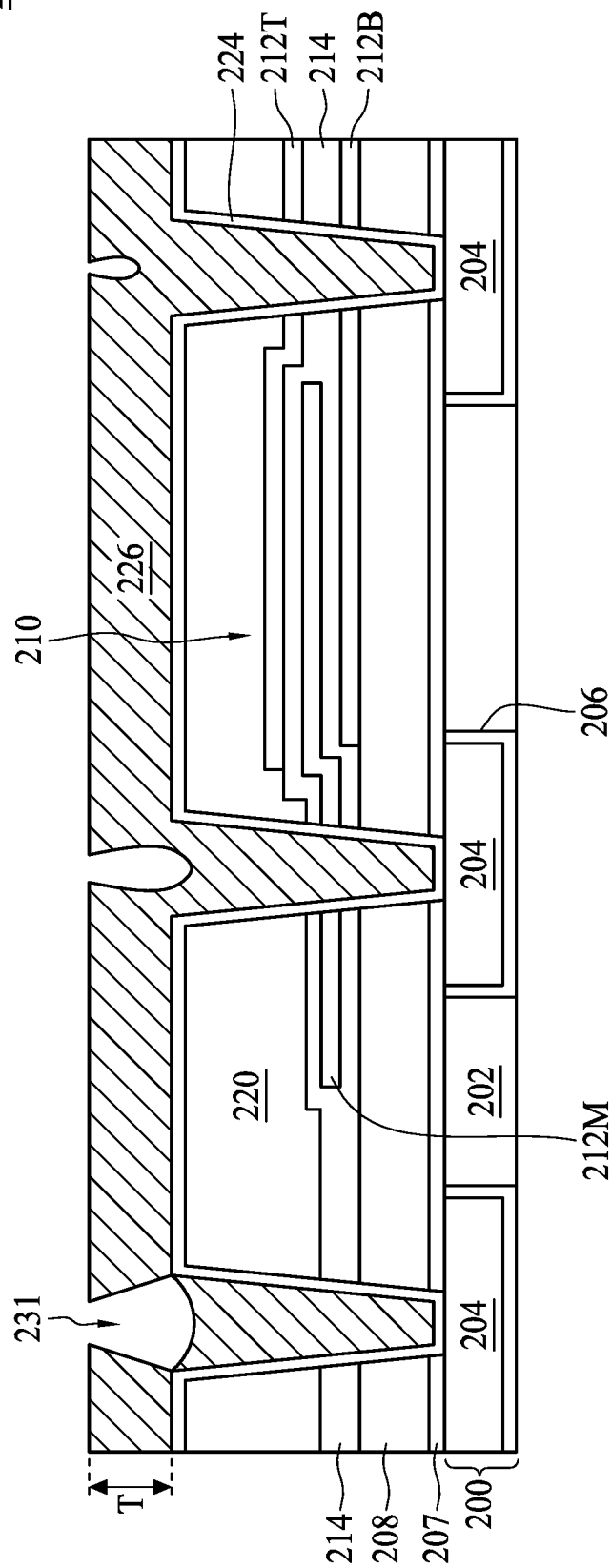

Referring to FIG. 5, a conductive layer 226 is formed over the insulating layer 220 according to operation 106. In some embodiments, the via opening 222 is filled with the conductive layer 226, as shown in FIG. 5. The conductive layer 226 may include copper (Cu), aluminum (Al), tungsten (W), cobalt (Co), or alloys thereof, such as AlCu, but the disclosure is not limited thereto. In some embodiments, a thickness T of the conductive layer 226 over the barrier layer 224 over a top surface of the insulating layer 220 is between 2000 Å and approximately 10000 Å, but the disclosure is not limited to this. It should be noted that because the depth of the via opening 222 is the sum of the thickness of the dielectric layer 208 and the thickness of the insulating layer 220, the via opening 222 has a high aspect ratio. During the forming of the conductive layer 226, the conductive layer 226 is formed from a bottom and sidewalls of the via opening 222, and also from a top surface over the insulating layer 220, and thus an overhang may be formed in a portion of the conductive layer 226. In some embodiments, a void or a seam 231 may be formed, as shown in FIG. 5. Additionally, the void or seam 231 may be formed in the conductive layer 226 with various shapes. For example, the void 231 may be formed with a drop shape over the via opening 222. In other embodiments, the void 231 may have an irregular shape formed over the via opening 222. In other embodiments, a depth of the void 231 is much greater than a width of the void 231, such that it can be referred to a seam. In some embodiment, a bottommost surface of the void 231 may be lower than a topmost surface of the barrier layer 224. In other embodiments, a bottommost surface of the void 231 may be lower than a topmost surface of the insulating layer 220. In some embodiments, a widest portion of the void 231 is substantially equal to a width of the top portion of the via opening 222. In other embodiments, the widest portion of the void 231 is less than the width of the top portion of the via opening 222. In some embodiments, a width of a top portion of the void 231 is equal to or less than the width of the via opening.

Figure 6:
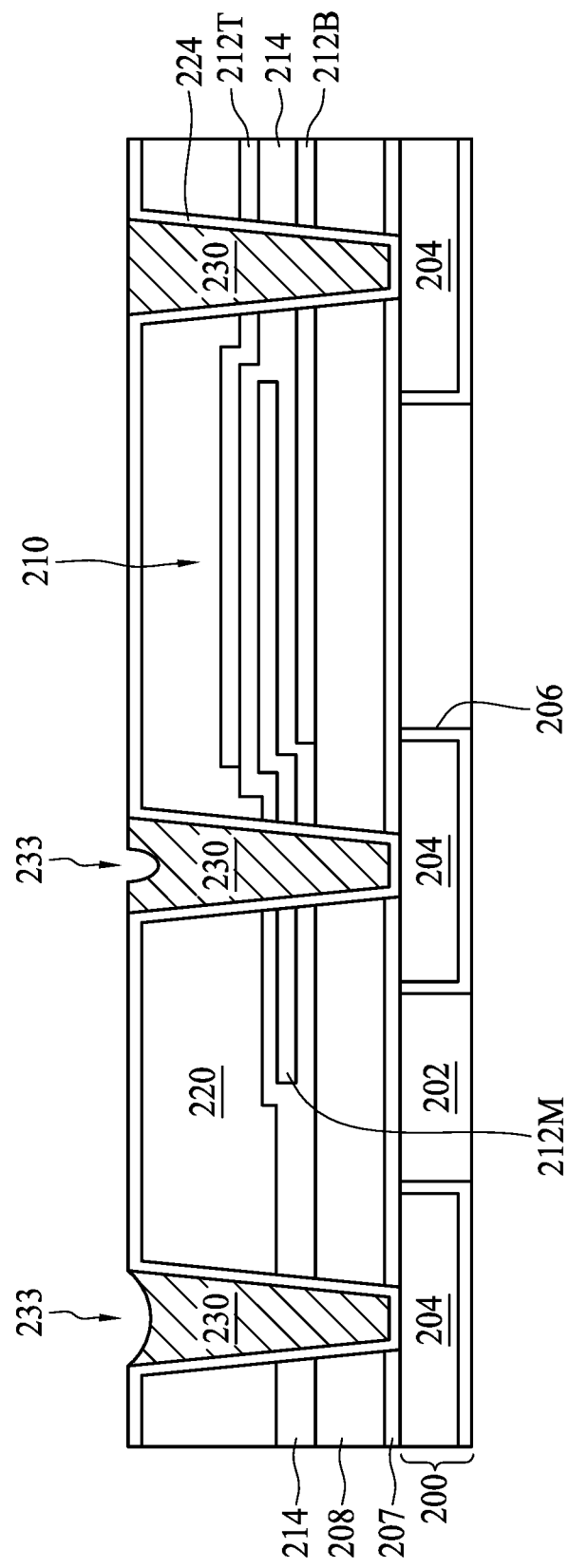

Referring to FIG. 6, a portion of the conductive layer 226 is removed, according to operation 108. In some embodiments, a planarization such as a chemical-mechanical polishing (CMP) can be performed to remove the portion of the conductive layer 226. It is noteworthy that the thickness T of the conductive layer 226 over the barrier layer 224 and the insulating layer 220 is equal to or greater than 2000 Å, to ensure that the via opening 222 is be filled. It is noteworthy that the thickness T of the conductive layer 226 over the barrier layer 224 and the insulating layer 220 is less than approximately 10000 Å, less conductive material is sacrificed during the CMP, and thus process cost can be reduced. In some embodiments, an etching can be performed to remove the portion of the conductive layer 226. Significantly, the portion of the conductive layer 226 over the top surface of the barrier layer 224 is removed. Consequently, the conductive layer 226 remains only in the via opening 222, and a connecting via 230 is formed, as shown in FIG. 6. In some embodiments, the overhang of the conductive layer 226 is removed, and the void 231 becomes a shallow recess 233 over a top surface of the connecting via 230, as shown in FIG. 6. Additionally, the recess 233 may be formed in the conductive layer 226 with various shapes. For example, the recess 233 may be formed over the connecting via 230 with a round shape having a curved bottom surface. In other embodiments, the recess 233 may have an irregular shape formed over the connecting via 230. In some embodiment, a bottommost surface of the recess 233 may be lower than a topmost surface of the barrier layer 224. In other embodiments, a bottommost surface of the recess 233 may be lower than a topmost surface of the insulating layer 220. In some embodiments, a widest portion of the recess 233 is substantially equal to a width of the top portion of the connecting via 230. In other embodiments, the widest portion of the recess 233 is less than the width of the top portion of the connecting via 230. In some embodiments, a width of a top portion of the recess 233 is equal to or less than the width of the connecting via 230. In some embodiments, the top surface of the barrier layer 224 and a top surface of the connecting via 230 may be coplanar with each other after the removing of the portion of the conductive layer 226, but the disclosure is not limited thereto. In other words, a surface evenness of the top surface formed of the connecting via 230 and the insulating layer 220 is improved.

Figure 7A:
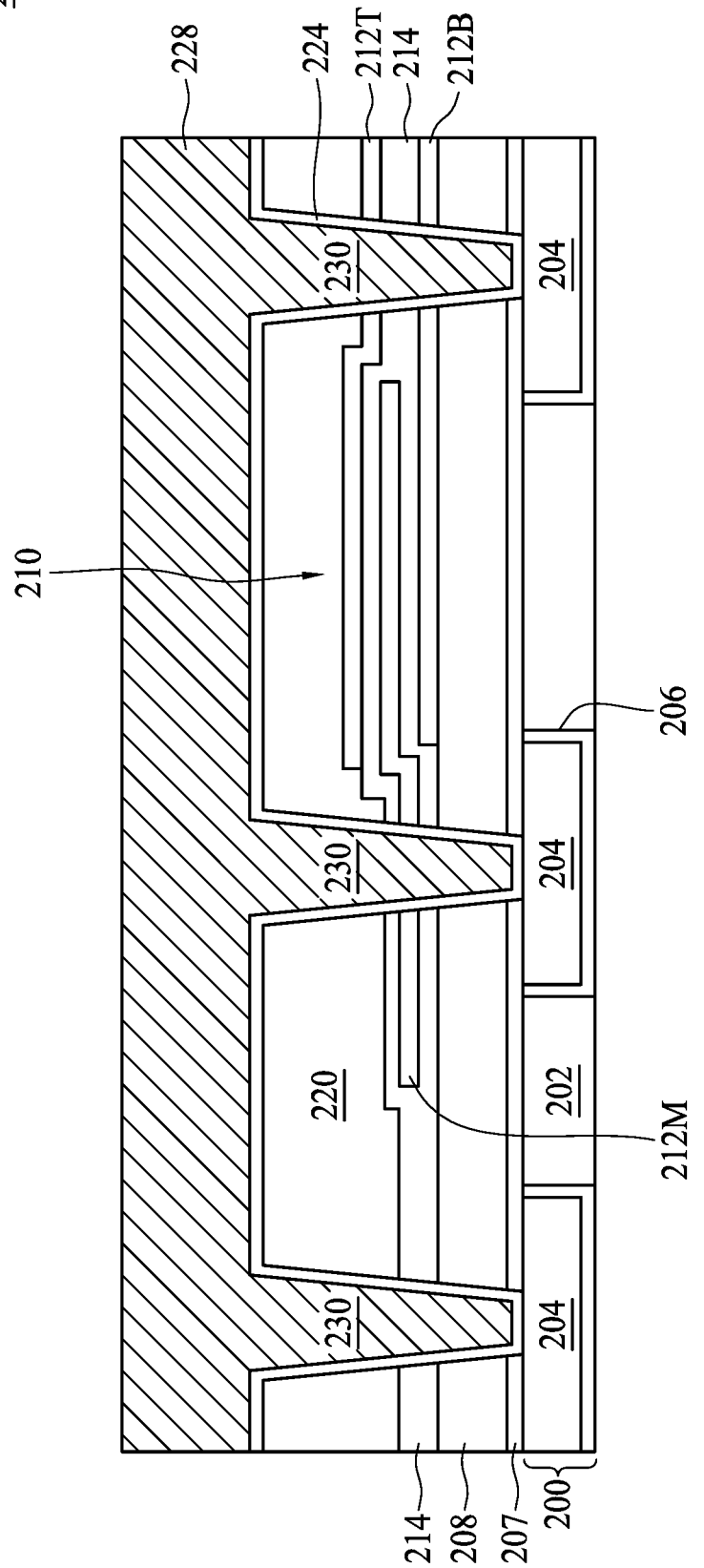

Referring to FIG. 7A, another conductive layer 228 is formed over the insulating layer 220 and the connecting via 230, according to operation 110. In some embodiments, the shallow recess 233 over the top surface of the connecting via 230 is filled with the conductive layer 228, and the conductive layer 228 is in contact with the connecting via 230, as shown in FIG. 7A. Further, the conductive layer 228 and the conductive layer 226 can include a same material, but the disclosure is not limited thereto. The conductive layer 228 can be formed by deposition or electro-less plating, but the disclosure is not limited thereto. It should be noted that because the surface evenness of a top surface formed of the connecting via 230 and the insulating layer 220 is improved, the conductive layer 228 can be formed with a consistent thickness and has an even top surface, as shown in FIG. 7A. Significantly, the overhang or void issue is mitigated. In some embodiments, a thickness of the conductive layer 228 is between approximately 25000 Å and 30000 Å, but the disclosure is not limited to this.

Figure 7B:
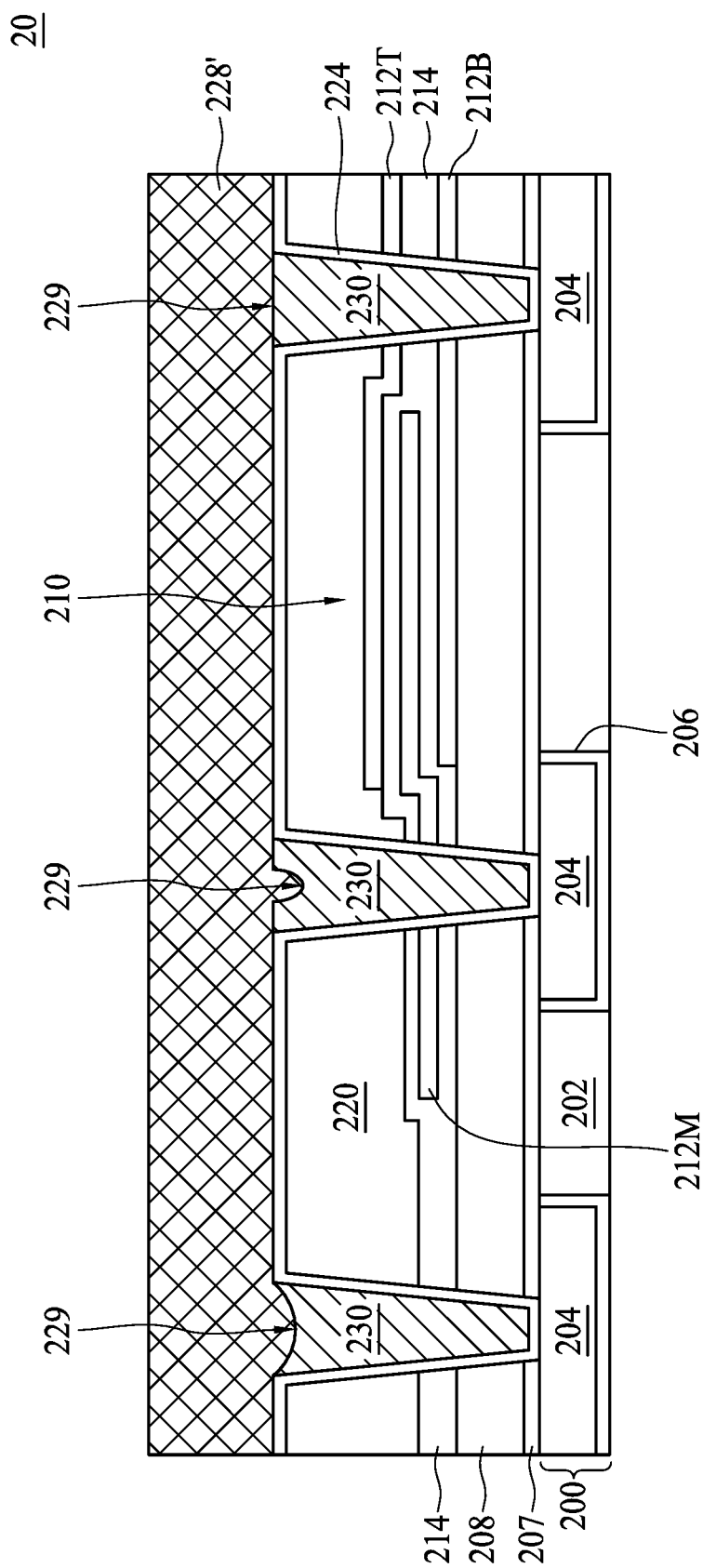

Referring to FIG. 7B, another conductive layer 228' can be formed over the insulating layer 220 and the connecting via 230, according to operation 110. In some embodiments, the shallow recess 233 over the top surface of the connecting via 230 is filled with the conductive layer 228', and the conductive layer 228' is in contact with the connecting via 230, as shown in FIG. 7B. Further, the conductive layer 228' and the conductive layer 226 can include different materials. Accordingly, an interface 229 may be formed between the conductive layer 228' and conductive layer 226, as shown in FIG. 7B. The conductive layer 228' can be formed by deposition or electro-less plating, but the disclosure is not limited thereto. It should be noted that because the surface evenness of a top surface formed of the connecting via 230 and the insulating layer 220 is improved, the conductive layer 228' can be formed with a consistent thickness and has an even top surface, as shown in FIG. 7B. Significantly, the overhang or void issue is mitigated. In some embodiments, a thickness of the conductive layer 228' is between approximately 25K Å and 30K Å, but the disclosure is not limited to this.

Figure 8:
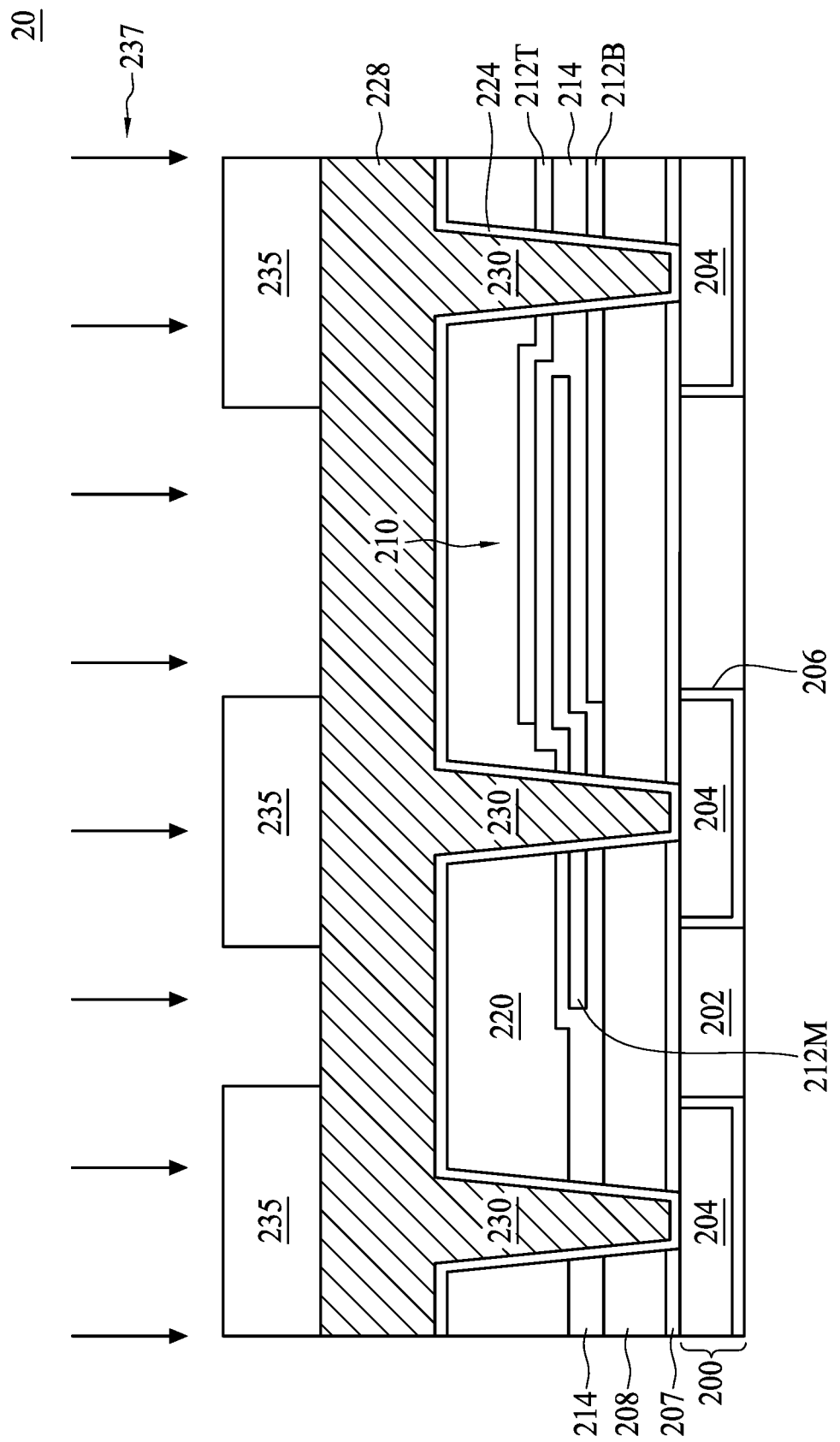
Figure 9:
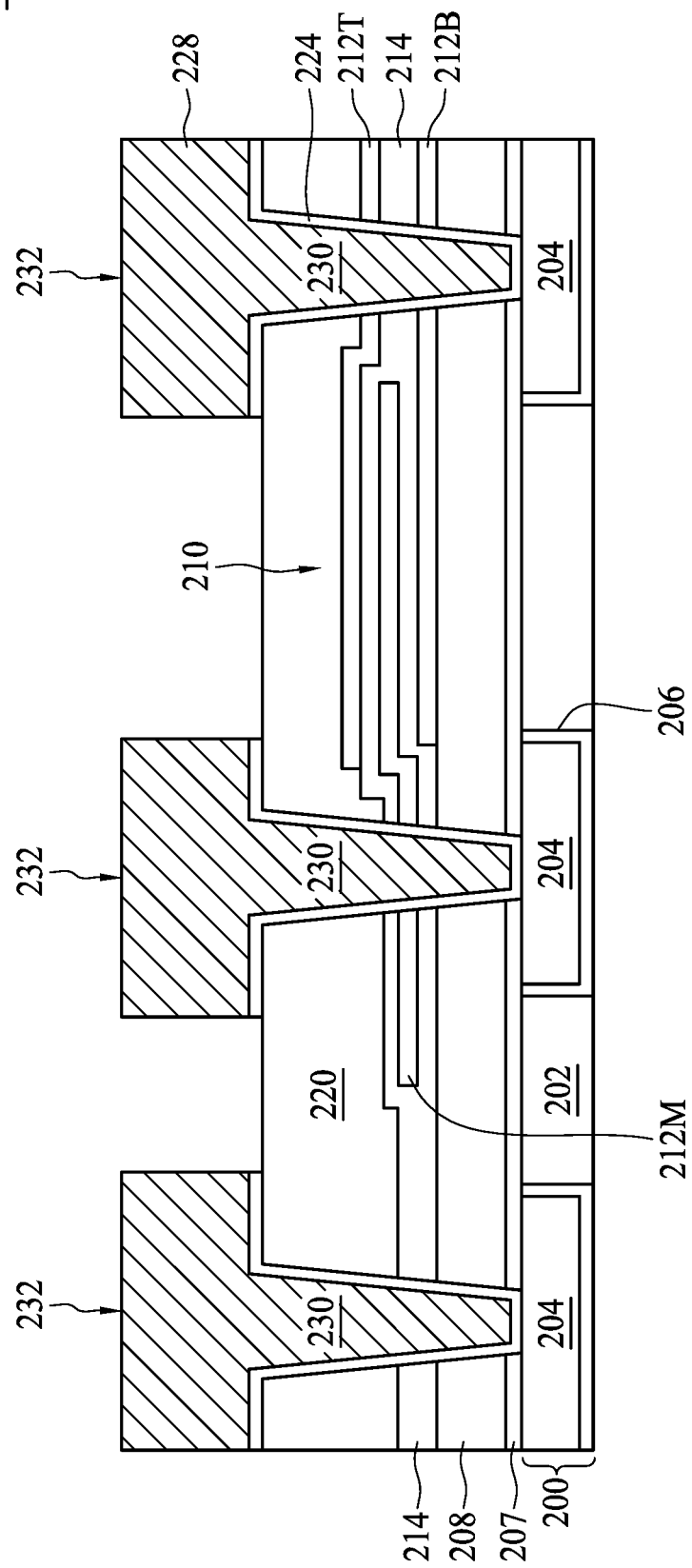

Referring to FIGS. 8 and 9, the conductive layer 228 and the barrier layer 224 are patterned in operation 112. In some embodiments, a patterned mask layer 235 can be formed over the conductive layer 228. The patterned mask layer 235 defines a location and a dimension of a connecting pad. Subsequently, an etching operation 237 is performed to remove portions of the conductive layer 228 exposed through the patterned mask layer 235, as shown in FIG. 8. Referring to FIG. 9, accordingly, a connecting pad 232 is formed over the insulating layer 220. As shown in FIG. 9, the connecting pad 232 is in contact with the connecting via 230, and separated from the insulating layer 220 by the barrier layer 224.

Figure 10:
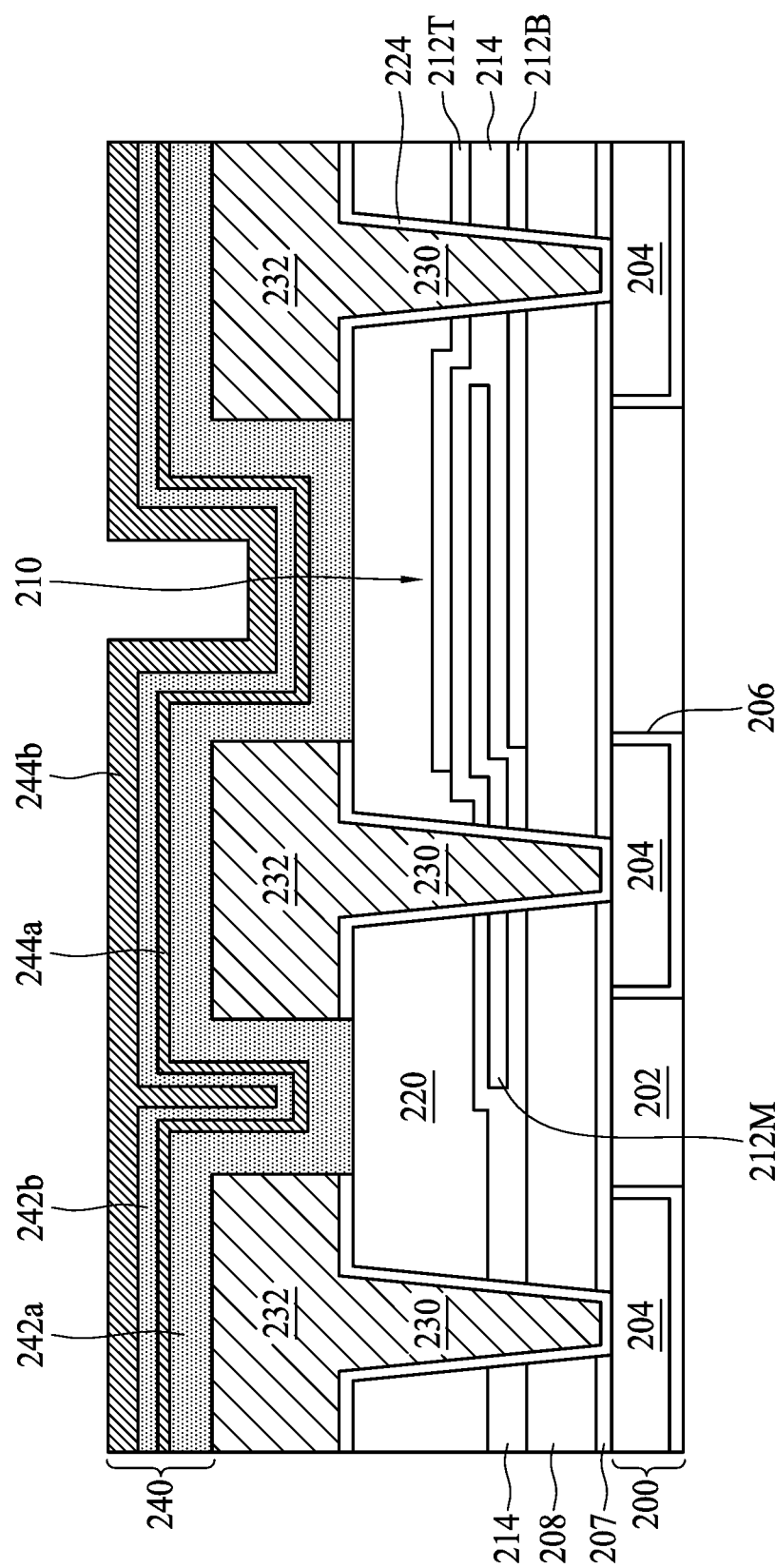

Referring to FIG. 10, after the forming of the connecting pad 232, an insulating stack 240 is formed over the connecting pad 232 and the insulating layer 220, according to operation 114. In some embodiments, the insulating stack 240 includes two different materials. In some embodiments, the insulating stack 240 includes a plurality of film pairs of the two material layers. For example, the insulating stack 240 can include a plurality of film pairs of silicon oxide and silicon nitride. In some embodiments, the insulating stack 240 can be referred to as an [oxide-nitride]n stack, wherein n is the number of repetitions, and can be an integer equal to or greater than 1. For example but not limited to, in some embodiments, n of the [oxide-nitride]n stack 240 is 2, and the [oxide-nitride]2 stack 240 includes two silicon oxide ($SiO_x$) layers and two silicon nitride ($Si_xN_y$) layers alternately arranged. In some embodiments, n of the [oxide-nitride]n stack 240 cannot be greater than 3, because the [oxide-nitride]n stack 240 would cause stress to damage the MIM capacitor 210. Additionally, a portion of the [oxide-nitride]n stack 240 may have an U shape in a cross-sectional view. In some embodiments, the U-shaped portion of the [oxide-nitride]n stack 240 may be formed between two connecting pads 232, as shown in FIG. 10, but the disclosure is not limited thereto.

In some embodiments, the forming of the insulating stack includes further operations. For example, a first insulating layer 242a, a second insulating layer 244a, a third insulating layer 242b and a fourth insulating layer 244b can be sequentially formed over the connecting pad 232 and the insulating layer 220. In some embodiments, the first and third insulating layers 242a and 242b include a same material, but the disclosure is not limited thereto. In some embodiments, at least the first insulating layer 242a can include the material the same as that of the insulating layer 220, but the disclosure is not limited thereto. In some embodiments, the second and fourth insulating layers 244a and 244b include a same material, but the disclosure is not limited thereto. However, the second and fourth insulating layers 244a and 244b include the material different from that of the first and third insulating layers 242a and 242b. For example but not limited to this, the first insulating layer 242a and the third insulating layer 242b can include silicon oxide, while the second insulating layer 244a and fourth insulating layer 244b can include silicon nitride layer. In such embodiments, the insulating stack 240 can be formed by the following operations. A first silicon oxide layer 242a is formed over the insulating layer 220 and the connecting pad 232, a first silicon nitride layer 244a is formed on the first silicon oxide layer 242a, a second silicon oxide layer 242b is formed on the first silicon nitride layer 244a, and a second silicon nitride layer 244b is formed on the second silicon oxide layer 242b. Accordingly, an [oxide-nitride]2 stack, such as an ONON stack 240 can be obtained as shown in FIG. 10.

In some embodiments, the first silicon oxide layer 242a can be the thickest layer in the insulating stack 240, but the disclosure is not limited to this. For example but not limited to this, the thickness of the first silicon oxide layer 242a can be between approximately 8000 Å and approximately 10000 Å. It should be noted that the first silicon oxide layer 242a is in contact with the insulating layer 220, sidewalls and a top surface of the connecting pad 232, as shown in FIG. 10. The thickness of the first silicon oxide layer 242a over the insulating layer 220 and the thickness of the first silicon oxide layer 242a over the sidewalls and the top surface of the connecting pad 232 are the same. In some embodiments, the first silicon nitride layer 244a can be the thinnest layer in the insulating stack 240, but the disclosure is not limited to this. For example but not limited to this, a thickness of the first silicon nitride layer 244a can be between approximately 2000 Å and approximately 4000 Å. In some embodiments, a thickness of the second silicon oxide layer 242b can be between approximately 4000 Å and approximately 6000 Å, but the disclosure is not limited to this. In some embodiments, a thickness of the second silicon nitride layer 244b can be greater than the thickness of the second silicon oxide layer 242b and the thickness of the first silicon nitride layer 244a. For example but not limited this, the thickness of the second silicon nitride layer 244b can be between approximately 7000 Å and approximately 9000 Å.

Figure 11:
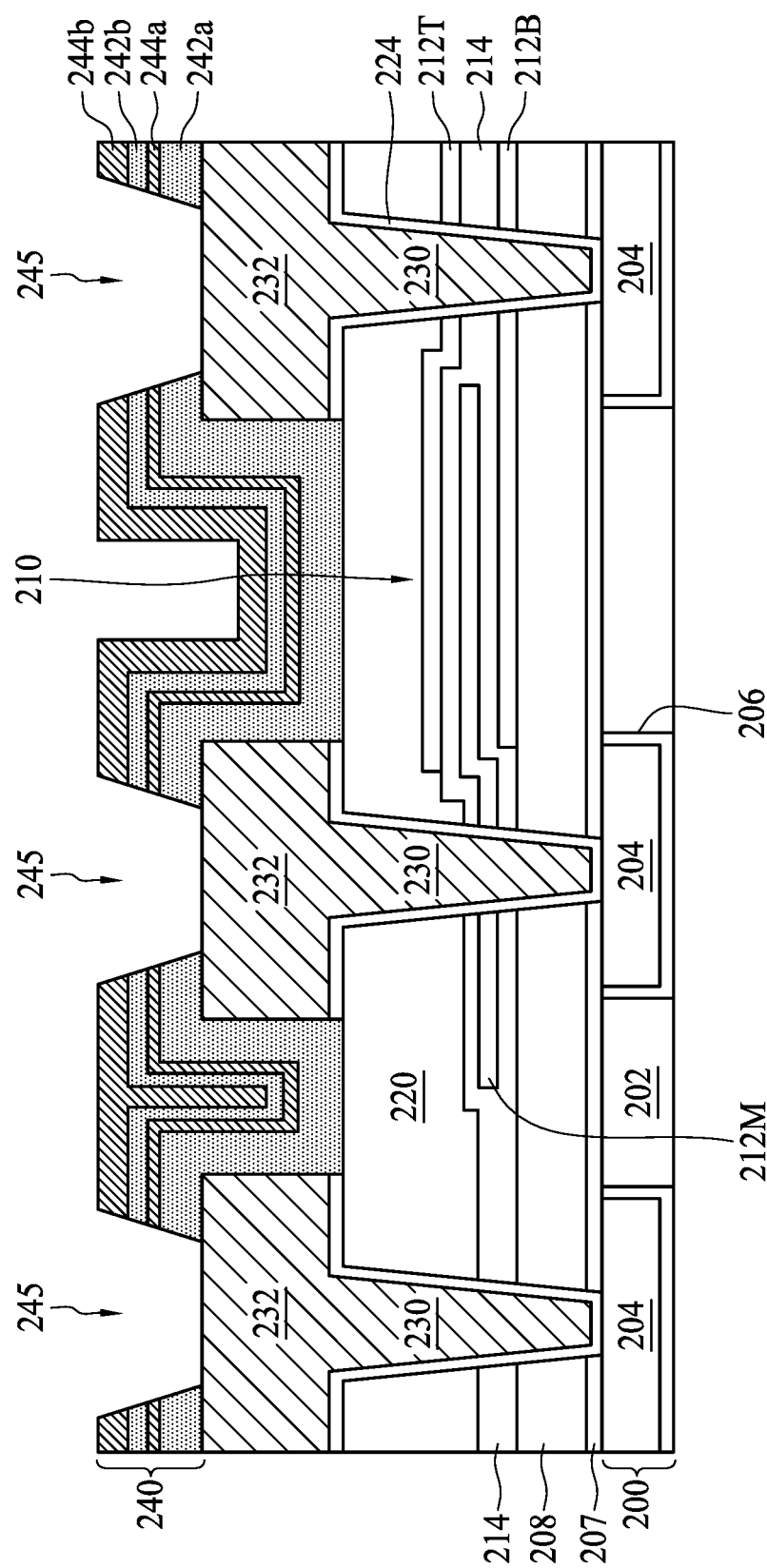

Referring FIG. 11, in some embodiments, the method 10 further includes an operation to remove a portion of the insulating stack 240 to form an opening 245 exposing a portion of the connecting pad 232. As shown in FIG. 11, the first silicon oxide layer 242a, the first silicon nitride layer 244a, the second silicon oxide layer 242b and the second silicon nitride layer 244b are exposed through sidewalls of the opening 245, while a portion of a top surface of the connecting pad 232 is exposed through a bottom of the opening 245.

Figure 12:
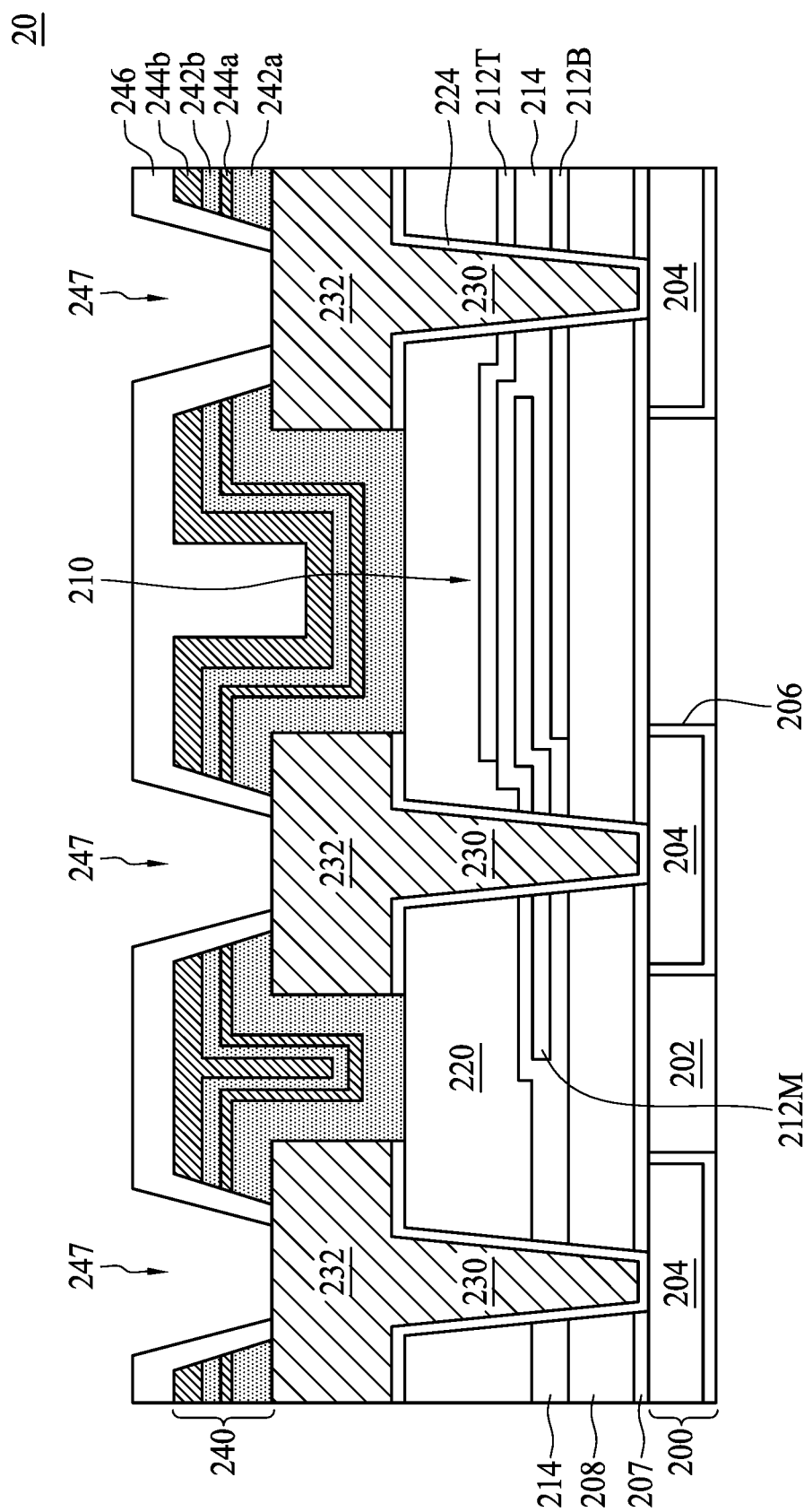

Referring to FIG. 12, in some embodiments, a polymer layer 246 can be formed over the insulating stack 240. The polymer layer 246 can include, an epoxy, polyimide (PI), benzocyclobutene (BCB), polybenzoxazole (PBO), and the like, although other relatively soft, often organic, dielectric materials can also be used. The polymer layer 246 can be formed over the insulating stack 240 by spin coating or other commonly used methods. A thickness of the polymer layer 246 can be between approximately 5 μm and approximately 30 μm, but the disclosure is not limited thereto. In some embodiments, the polymer layer 246 is thick enough to provide an even surface. Further, polymer layer 246 is patterned to form an opening 247, which is corresponding to the opening 245. As shown in FIG. 12, a portion of the connecting pad 232 can be exposed through the opening 247. The patterning of polymer layer 246 may include photolithography techniques, and a curing may then be performed to cure the polymer layer 246.

Accordingly, the first silicon oxide layer 242a, the first silicon nitride layer 244a, the second silicon oxide layer 242b and the second silicon nitride layer 244b originally exposed through the sidewalls of the opening 245 are now covered by the polymer layer 246. However, a portion of the top surface of the connecting pad 232 is exposed through the opening 245 and the polymer layer 246, as shown in FIG. 12.

Figure 13:
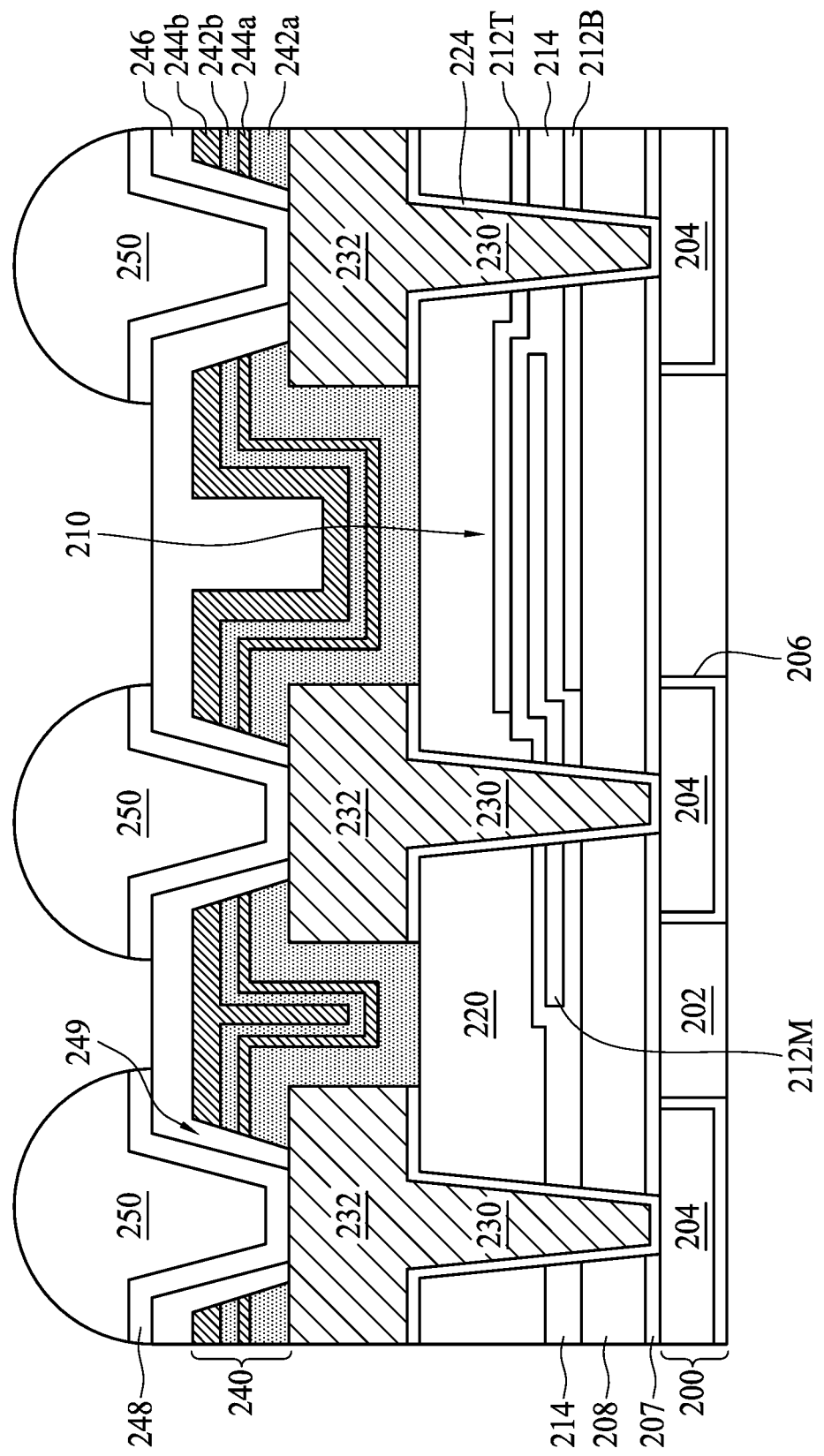

Referring to FIG. 13, an under bump metallization (UBM) 248 can be formed in the opening 245. In some embodiments, the UBM 248 is conformally formed to line the bottom and sidewalls of the opening 245. After the forming of the UBM 248, an external conductor 250 is formed in the opening 245. As shown in FIG. 13, the external conductor 250 fills the opening 245. In some embodiments, the external conductor 250 can include a bump such as a Cu bump and a solder, though not shown. Accordingly, an electrical connection between external source, the integrated circuit in the substrate 200 and/or the MIM capacitor 210 is constructed.

It should be noted that during the forming of the external conductor 250, a stress is generated directly onto layers underneath. In some comparative embodiments, a single thick silicon oxide layer may be provided, and the polymer layer 246, the UBM 248 and external conductor 250 may be formed over the thick silicon oxide layer. However, it is found that the thick silicon oxide layer is not strong enough to against the stress and thus crack may be formed. Such crack may cause the corrosion of conductive layers during a pin hole test, and the semiconductor structure 20 including the MIM capacitor 210 is failed in the pin hole test. In other comparative embodiments, a single thick silicon nitride layer may be provided, and the polymer layer 246, the UBM 248 and external conductor 250 may be formed over the thick silicon nitride layer. However, it is found that the thick silicon nitride layer itself generates a stress toward the layers underneath and causes other problem. Different from the abovementioned comparative embodiments, the ONON stack 240 provides the silicon nitride layers 244a and 244b that have sufficient mechanical strength to against the stress generated during the forming of the external conductor 250. Further, the ONON stack 240 provides the silicon oxide layers 242a and 242b that serve as buffer between the silicon nitride layers 244a, 244b and the insulating layer 220 so that the stress generated from the silicon nitride layers 244a and 244b can be mitigated. Further, the first silicon oxide layer 242a provides adhesion between the silicon nitride layers 244a, 244b and the insulating layer 220.

Accordingly, a semiconductor structure 20 including a MIM capacitor 210 is provided. The semiconductor structure 20 includes a substrate 200, a MIM capacitor 210 disposed over the substrate 200, an insulating layer 220 disposed over the substrate 200 and the MIM capacitor 210, an insulating stack 240 disposed over the insulating layer 220 and the MIM capacitor 210, a connecting via 230 disposed in the insulating layer 220, and a connecting pad 232 disposed over the insulating layer 220. In some embodiments, the semiconductor structure 20 further includes an external conductor 250 disposed over the connecting pad 232. In some embodiments, a UBM 248 is disposed between the external conductor 250 and other elements such as the connecting pad 232, and a polymer layer 246 is disposed between the UBM 248 and the insulting stack 240, as shown in FIG. 13. In some embodiments, the insulating stack 240 can include a recessed portion 249, and the connecting pad 232 is exposed through the recessed portion 249, as shown in FIG. 13. Accordingly, the UBM 248 is in contact with the connecting pad 232 exposed through the recessed portion 249, and the external conductor 250 is electrically connected to the connecting pad 232 through the UBM 248.

As mentioned above, electrical components and an interconnection structure may be formed over the substrate 200. The interconnection structure may include conductive features, such as conductive lines or conductive vias, and insulating layers 202 electrically insulating the conductive features. The conductive lines at a same level are collectively referred to as a connecting layer 204. In some embodiments, the interconnection structure may include a plurality of connecting layers that are interconnected through the conductive vias, though not shown. It should be easily realized only insulating layer 202 and the topmost connecting layer 204 are shown in FIG. 13 for clarity, however those skilled in the art would easily realize that other connecting layers can be disposed in the insulating layers 202 according to different design requirements. Further, the semiconductor structure 20 can include an insulating layer 208 disposed over the topmost connecting layer 204, and the insulating layer 220 and the MIM capacitor 210 are disposed over the insulating layer 208 and the connecting layer 204.

As mentioned above, the insulating stack 240 can include a plurality of film pairs of the two material layers. For example, the insulating stack 240 can include a plurality of film pairs of silicon oxide and silicon nitride. In some embodiments, the insulating stack 240 can be referred to as an [oxide-nitride]n stack, wherein n is the number of repetitions, and can be an integer equal to or greater than 2. For example but not limited to, in some embodiments, n of the [oxide-nitride]n stack 240 is 2, and the [oxide-nitride]2 stack 240 includes two silicon oxide layers and two silicon nitride layers alternately arranged. That is, the insulating stack 240 is an ONON stack including a first silicon oxide layer 242a, a first silicon nitride layer 244a, a second silicon oxide layer 242b and a second silicon nitride layer 244b upwardly disposed over the insulating layer 220. As shown in FIG. 13, the first silicon oxide layer 242a is in contact with the insulating layer 220 and a portion of a top surface of the connecting pad 232. A thickness of the first silicon oxide layer 242a over the insulating layer 220 and a thickness of the first silicon oxide layer 242a over the portion of the top surface of the connecting pad 232 are the same.

In some embodiments, the first and second silicon oxide layer 242a and 242b are provided to serve as a buffer and to mitigate stress from the external conductor 250 and from the first and second silicon nitride layers 244a and 244b. Further, the first silicon oxide layer 242a is the thickest layer in the insulating stack 240 because the first silicon oxide layer 242a is the lowest layer and is thick enough to mitigate the stress from the over-layers. Further, the first silicon oxide layer 242a provides adhesion between the insulating stack 240 and the insulating layer 220. In some embodiments, the first silicon nitride layer 244a and the second silicon nitride layer 244b are provided to against the stress from the external conductor 250. Further, a thickness of the second silicon nitride layer 244b, which is the first layer confronting the stress generated during the forming of the external conductor 250, is greater than a thickness of the second silicon oxide layer 242b and the first silicon nitride layer 244a so that the second silicon nitride layer 244b has a sufficient thickness to against the stress.

Still referring to FIG. 13, in some embodiments, the connecting via 230 penetrates a portion of the insulating layer 220 and a portion of the insulating layer 208, and is in contact with the connecting layer 204. Accordingly, the connecting via 230 is electrically connected to the connecting layer 204. Further, the external conductor 250 may be electrically connected to the connecting layer 204 through the connecting pad 232 and the connecting via 230, as shown in the leftmost of FIG. 13. In some embodiments, the connecting via 230 penetrates a portion of the insulating layer 220, a portion of the insulating layer 208 and a portion of the MIM capacitor 210, such as the middle electrode layer 212M of the MIM capacitor 210, and is in contact with the connecting layer 204. Accordingly, the connecting via 230 is electrically connected to the connecting layer 204. Further, the external conductor 250 may be electrically connected to the connecting layer 204 and the MIM capacitor 210 through the connecting pad 232 and the connecting via 230, as shown in the middle of FIG. 13. In still other embodiments, the connecting via 230 penetrates a portion of the insulating layer 220, a portion of the insulating layer 208 and a portion of the MIM capacitor 210, such as the top and bottom electrode layers 212T and 212B of the MIM capacitor 210, and is in contact with the connecting layer 204. Accordingly, the connecting via 230 is electrically connected to the connecting layer 204. Further, the external conductor 250 may be electrically connected to the connecting layer 204 and the MIM capacitor 210 through the connecting pad 232 and the connecting via 230, as shown in the rightmost of FIG. 13.

In some embodiments, the MIM capacitor 210 serves as a decouple capacitor, with the top electrode layer 212T and the bottom electrode 212B being electrically connected to power supply lines such as VDD and VSS, respectively, through the external conductor 250. Accordingly, the MIM capacitor 210 is used to filter noise and/or also used as a power storage for reducing the voltage variation resulted from the current-drawn from the power source.

Figure 14:
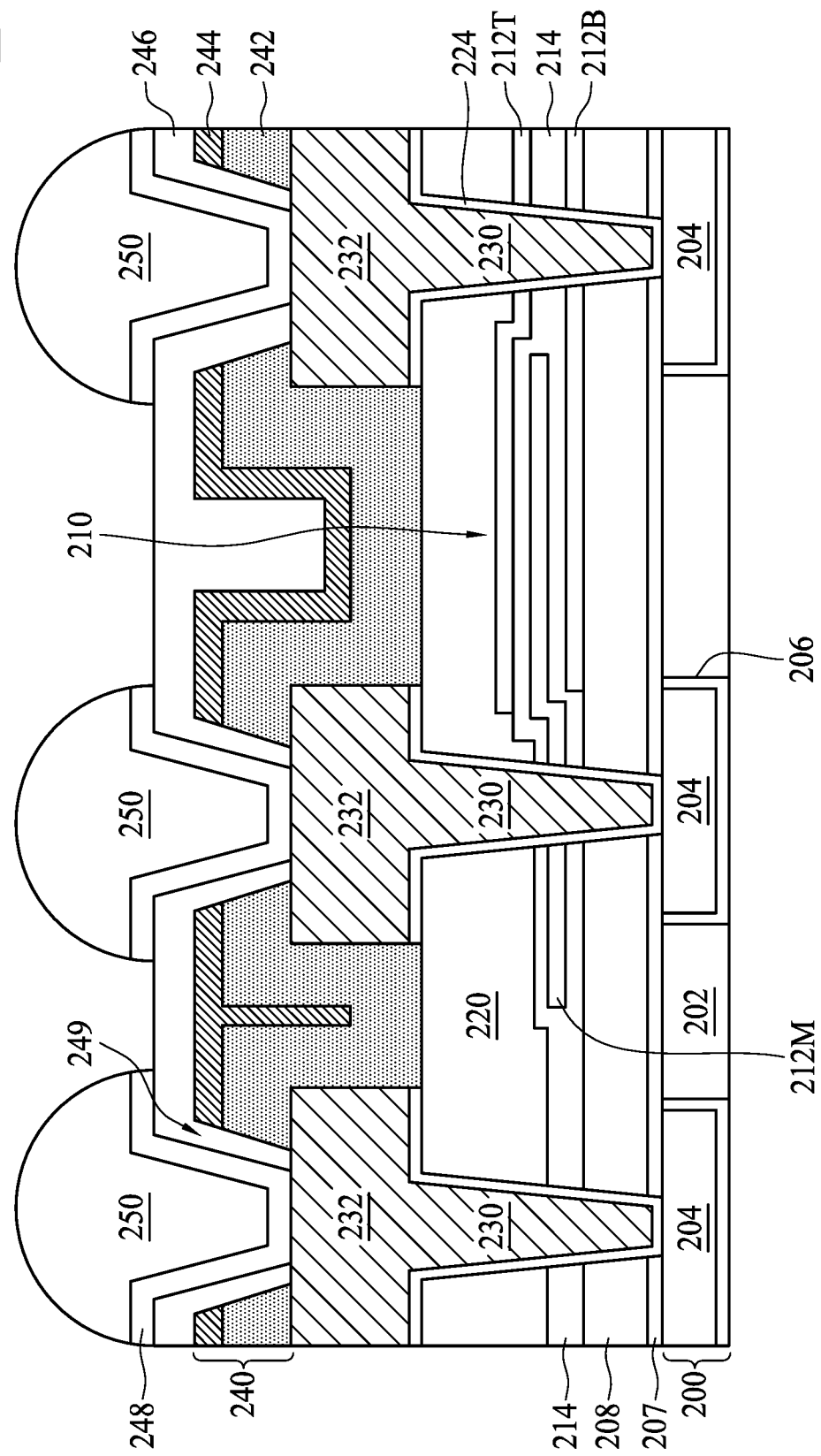
FIG. 14 is a schematic drawing illustrating a semiconductor structure including a MIM capacitor according to aspects of the present disclosure in one or more embodiments.

Referring to FIG. 14, which is a schematic drawing illustrating a semiconductor structure including a MIM capacitor according to aspects of the present disclosure in one or more embodiments. It should be noted that details of same elements shown in FIGS. 13 and 14 are omitted for brevity. In some embodiments, the insulating stack 240 can be referred to as an [oxide-nitride]n stack, wherein n is the number of repetitions, and can be an integer equal to 1. Additionally, a portion of the [oxide-nitride]n stack 240 may have an U shape in a cross-sectional view. In such embodiments, [oxide-nitride] stack 240 includes a silicon oxide layer 242 and a silicon nitride layer 244. A thickness of the silicon oxide layer 242 is greater than a thickness of the silicon nitride layer 244. In some embodiments, a ratio of the thickness of the silicon oxide layer 242 to the thickness of the silicon nitride layer 244 is between approximately 2 and approximately 4. For example, the thickness of the silicon oxide layer 242 can be 15000 Å and the thickness of the silicon nitride layer 244 can be 7000 Å, but the disclosure is not limited thereto. In some embodiments, the ratio of the thickness of the silicon oxide layer 242 to the thickness of the silicon nitride layer 244 is greater than approximately 2, such that the silicon oxide layer 242 serves as a sufficient buffer layer to resist stress from the silicon nitride layer 244 and to provide the underneath MIM capacitor 210. In some embodiments, the ratio of the thickness of the silicon oxide layer 242 to the thickness of the silicon nitride layer 244 is less than approximately 2, such that the silicon oxide layer 242 itself will not generate stress to the underneath MIM capacitor 210.

According to the method 10 for forming the semiconductor structure 20, the connecting via 230 and the connecting pad 232 are formed individually. As mentioned above, during the forming of the connecting via 230, the via opening 222 has a high aspect ratio, an overhang may be formed or a void or a seam may be formed during filling the via opening 222 with the conductive layer 226. The overhang, void or seam issue can be mitigated by the removing of the portion of the conductive layer 226 even in an insulating layer 220 having a thickness greater than 50000 Å, and an even surface formed of the connecting via 230 and the insulating layer 220 can be obtained. Accordingly, the later formed connecting pad 232 can be formed over the even surface and thus reliability of the electrical connection (i.e., the connecting pad 232 and the connecting via 230) is improved.

Further, according to the method 10 for forming the semiconductor structure 20, the insulating stack 240 (e.g., the ONON stack 240) is provided to mitigate the stress issue during the forming of the external conductor 250. As mentioned above, the silicon nitride layers 244a and 244b provide sufficient mechanical strength to resist the stress from the forming of the external conductor 250 while the silicon oxide layers 242a and 242b provide buffer to mitigate stress from the silicon nitride layers 244a and 244b. Accordingly, cracks caused by the stress from the external conductor 250 and from the silicon nitride layers 244a and 244b are mitigated.

It should be noted that since the seam or void issue and the crack issue are both mitigated, reliability of the semiconductor structure 20 including the MIM capacitor 210 is improved.

In some embodiments, a semiconductor structure is provided. The semiconductor structure includes a substrate, a MIM capacitor disposed over the substrate, a first insulating layer disposed over the MIM capacitor, an ONON stack disposed over the first insulating layer, a connecting via disposed in the first insulating layer, and a connecting pad disposed in the ONON stack and in contact with the connecting via. In some embodiments, the ONON stack covers sidewalls of the connecting pad and a portion of a top surface of the connecting pad.

In some embodiments, a semiconductor structure is provided. The semiconductor structure includes a substrate, a MIM capacitor disposed over the substrate, an insulating layer disposed over the MIM capacitor, an ONON stack disposed over the insulating layer, a connecting via disposed in the insulating layer, a connecting pad disposed in the ONON stack and in contact with the connecting via, and an external conductor disposed over the connecting pad.

In some embodiments, a method for manufacturing a semiconductor structure including a MIM capacitor is provided. The method includes following operations. A substrate including a MIM capacitor and an insulating layer formed thereon is received. A via opening penetrating the insulating layer is formed. A first conductive layer is formed over the insulating layer. In some embodiments, the via opening is filled with the first conductive layer, and a void is formed in the first conductive layer correspondingly over the via opening. A portion of the first conductive layer is removed to form a connecting via and the void is removed to form a recess over a top portion of the connecting via. A second conductive layer is formed over the insulating layer. The second conductive layer is patterned to form a connecting pad over the insulating layer. In some embodiments, the connecting pad is in contact with the connecting via. An insulating stack is formed over the connecting pad and the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a substrate;
   a MIM capacitor disposed over the substrate;
   a first insulating layer disposed over the MIM capacitor;
   an oxide-nitride-oxide-nitride (ONON) stack disposed over the first insulating layer;
   a connecting via disposed in the first insulating layer; and
   a connecting pad disposed in the ONON stack and in contact with the connecting via,
   wherein the ONON stack covers sidewalls of the connecting pad and a portion of a top surface of the connecting pad, the ONON stack comprises a first silicon oxide layer, a first silicon nitride layer, a second silicon oxide layer and a second silicon nitride layer upwardly disposed over the insulating layer, and the first silicon oxide layer is in contact with the first insulating layer and a portion of the top surface of the connecting pad.

2. The semiconductor structure of claim 1, wherein a thickness of the first silicon oxide layer over the first insulating layer and a thickness of the first silicon oxide layer over the portion of the top surface of the connecting pad are the same.

3. The semiconductor structure of claim 1, wherein a thickness of the second silicon nitride layer is greater than a thickness of the second silicon oxide layer and a thickness of the first silicon nitride layer.

4. The semiconductor structure of claim 1, further comprising:
   a second insulating layer; and
   a connecting layer disposed in the second insulating layer, wherein the first insulating layer and the MIM capacitor are disposed over the second insulating layer and the second connecting layer.

5. The semiconductor structure of claim 4, wherein the connecting via penetrates a portion of the first insulating layer and a portion of the second insulating layer, and the connecting via is electrically connected to the connecting layer.

6. The semiconductor structure of claim 4, wherein the MIM capacitor is electrically connected to the connecting layer by the connecting via.

7. The semiconductor structure of claim 1, further comprising a polymer layer disposed over the ONON stack, wherein the polymer layer covers another portion of the top surface of the connecting pad.

8. The semiconductor structure of claim 7, further comprising an under bump metallization disposed between on the polymer layer and a portion of the connecting pad exposed through the polymer layer.

9. The semiconductor structure of claim 8, further comprising an external conductor disposed on the under bump metallization.

10. A semiconductor structure comprising:
a substrate;
a MIM capacitor disposed over the substrate;
an insulating layer disposed over the MIM capacitor;
an ONON stack disposed over the insulating layer;
a connecting via disposed in the insulating layer;
a connecting pad disposed in the ONON stack and in contact with the connecting via;
an external conductor disposed over the connecting pad; and
a polymer layer disposed over the ONON stack, wherein the ONON stack covers sidewalls and a portion of a top surface of the connecting pad and the polymer layer covers another portion of the top surface of the connecting pad.

11. The semiconductor structure of claim 10, further comprising an under bump metallization disposed on the polymer layer and a portion of the connecting pad exposed through the polymer layer.

12. The semiconductor structure of claim 10, wherein the ONON stack comprises a first silicon oxide layer, a first silicon nitride layer, a second silicon oxide layer and a second silicon nitride layer upwardly disposed over the insulating layer.

13. The semiconductor structure of claim 12, wherein the first silicon oxide layer is in contact with the insulating layer and a portion of a top surface of the connecting pad, and a thickness of the first silicon oxide layer over the insulating layer and a thickness of the first silicon oxide layer over the portion of the top surface of the connecting pad are the same.

14. A method of forming a semiconductor structure including a MIM capacitor, comprising:
receiving a substrate comprising a MIM capacitor and an insulating layer formed thereon;
forming a via opening penetrating the insulating layer;
forming a first conductive layer over the insulating layer, wherein the via opening is filled with the first conductive layer and a void is formed in the first conductive layer correspondingly over the via opening;
removing a portion of the first conductive layer and the void to form a connecting via and a recess over a top portion of the connecting via;
forming a second conductive layer over the insulating layer to fill the recess;
patterning the second conductive layer to form a connecting pad over the insulating layer, wherein the connecting pad is in contact with the connecting via; and
forming an insulating stack over the connecting pad and the insulating layer.

15. The method of claim 14, wherein a top surface of the insulating layer and a top surface of the connecting via are coplanar with each other after the removing of the portion of the first conductive layer.

16. The method of claim 14, wherein the first conductive layer and the second conductive layer comprise a same material.

17. The method of claim 14, further comprising forming a barrier layer before the forming of the first conductive layer.

18. The method of claim 14, further comprising:
removing a portion of the insulating stack to form an opening exposing a portion of the connecting pad; and
forming an external conductor in the opening.

19. The method of claim 14, wherein the forming of the insulating stack further comprises:
forming a first silicon oxide layer over the insulating layer and the connecting pad;
forming a first silicon nitride layer on the first silicon oxide layer;
forming a second silicon oxide layer on the first silicon nitride layer; and
forming a second silicon nitride layer on the second silicon oxide layer.

20. The method of claim 19, wherein the first silicon oxide layer is in contact with the first insulating layer, a sidewall of the connecting pad and a portion of a top surface of the connecting pad, and a thickness of the first silicon oxide layer over the first insulating layer and a thickness of the first silicon oxide layer over the portion of the top surface of the connecting pad are the same.

* * * * *